(12) United States Patent
Liu et al.

(10) Patent No.: US 8,749,407 B2
(45) Date of Patent: Jun. 10, 2014

(54) METHOD AND SYSTEM FOR DETECTING HIDDEN GHOST KEYS ON KEYBOARD MATRIX

(75) Inventors: Wen-Tong Liu, Taipei (TW); Chien-Hui Chang, Taipei County (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 1300 days.

(21) Appl. No.: 12/502,432

(22) Filed: Jul. 14, 2009

(65) Prior Publication Data

US 2010/0253553 A1    Oct. 7, 2010

(30) Foreign Application Priority Data

Apr. 2, 2009   (TW) .............................. 0910038458 A

(51) Int. Cl.
  *H03K 17/94*      (2006.01)
  *H03M 11/00*      (2006.01)
  *G06F 13/12*      (2006.01)
  *G06F 13/38*      (2006.01)

(52) U.S. Cl.
  USPC .................. 341/26; 341/20; 341/24; 341/25; 710/67; 710/73

(58) Field of Classification Search
  USPC ........... 341/20–35; 400/472–496; 710/67, 73; 345/168; 714/813
  See application file for complete search history.

(56) References Cited

U.S. PATENT DOCUMENTS 6,587,095 B2 *  7/2003  Wang et al. .................... 345/168
8,264,384 B2 *  9/2012  Tsao et al. ....................... 341/26

* cited by examiner

*Primary Examiner* — Hai Phan
*Assistant Examiner* — Franklin Balseca
(74) *Attorney, Agent, or Firm* — Li & Cai Intellectual Property (USA) Office

(57) ABSTRACT

The present invention discloses a method and system for detecting hidden ghost keys on a keyboard matrix. The keyboard matrix is composed of multiple rows crossing with multiple lines that form multiple key-locating positions. The method comprises: selecting multiple preset keys from the matrix; detecting ghost keys among the matrix based on the selected preset keys; selecting multiple examining keys from the preset keys and the detected ghost keys, based on that at least one ghost key is included in the examining keys; and determining hidden ghost keys based on the examining keys. The system detects ghost keys among the matrix via a preset key selecting unit and a ghost key detecting unit, which selects multiple examining keys via an examining key selecting unit, and determines hidden ghost keys based on the examining keys through a hidden ghost keys detecting unit.

10 Claims, 6 Drawing Sheets

METHOD AND SYSTEM FOR DETECTING HIDDEN GHOST KEYS ON KEYBOARD MATRIX

BACKGROUND OF THE INVENTION

1. Field of the Invention

The present invention relates to a method and a system for detecting hidden ghost keys on a keyboard matrix, in particular, to a method and a system for detecting hidden ghost keys from a plurality of keys of a matrix installed in a keyboard.

2. Description of Related Art

In order to avoid having excessive connected wires incurring higher manufacturing cost and inconvenient assembling process, manufacturers generally design a keyboard by a keyboard matrix. For keyboards designed with a keyboard matrix, the occurrence of ghost keys becomes an indispensible factor for the design of a conventional keyboard due to the physical properties of the keyboard matrix.

With reference to FIG. 1A, a keyboard matrix includes row scanning lines A, B and column scanning lines 1, 2 interlaced with the row scanning lines A, B respectively, and a method for detecting a pressed key of a keyboard sequentially scans the interlaced scanning lines A, B, 1, 2 in the keyboard, and determines whether or not a key w, x, y, or z is pressed at any of the interaction of the scanning lines, such that the scanning lines form a loop, wherein each pressed key is similar to a switch for connecting the row and the column scanning lines. If a key is pressed to electrically connect a scanning line (or turn on a switch) at an intersection, such that the interlaced row and column scanning lines form a loop, then the keyboard controller may determine which key is pressed and generates a corresponding key control signal according to the position of the formed loop.

In FIG. 1A, A-1 and A-2 form a loop after the electric potentials of the sequentially scanned A-1, A-2, B-1, and B-2 have changed, and thus the keyboard controller determines that keys w and y are pressed at positions A-1 and A-2, and generates key control signals corresponding to the keys w and y.

However, if three keys w, x, and y on the keyboard matrix as shown in FIG. 1B are pressed simultaneously, then A-1, A-2 and B-1 forming a loop; wherein although the key z at the intersection B-2 has not been connected to the scanning lines B and 2 directly, signals can still be transmitted through the path B-1-A-2 as indicated by the line Cir of the loop path in FIG. 1B. The fact that even though the key z is not pressed to connect the scanning line B-2, yet B-2 still forms a loop indirectly subsequently leads to a misjudgment that the key z has been pressed at the B-2 position. The key z in this example is referred to as a "ghost key", which is a key not pressed on a keyboard but is still determined as having been pressed.

In other words, common row scanning lines or column scanning lines exist in the "#" shaped position of w, x, y, and z on the keyboard matrix, and thus not only the key z becomes a ghost key when the keys w, x, y are pressed simultaneously, but the remaining fourth key also becomes a ghost key when any three out of the four keys are pressed simultaneously.

To prevent a misjudgment of the input state of a key from the keyboard, manufacturers find the position where a ghost key may occur on the keyboard matrix, and then eliminate or change the key position when a key is installed to a key position of the keyboard, so as to assure that no ghost key occurs during a key input of the keyboard.

In other words, common row scanning lines or column scanning lines exist in the "#" shaped position of w, x, y, and z on the keyboard matrix. In an exemplary example, the key z becomes a ghost key when the keys w, x, y are pressed simultaneously. In general, a fourth key becomes a ghost key when the other three of the four keys are pressed simultaneously.

SUMMARY OF THE INVENTION

Therefore, it is a primary objective the present invention to provide a method and a system for detecting hidden ghost keys from multiple keys installed on a keyboard matrix.

To achieve the foregoing objective, the present invention provides a method for detecting hidden ghost keys from a plurality of keys installed on a keyboard matrix of a keyboard, wherein the keyboard matrix is composed of a plurality of row scanning lines and a plurality of column scanning lines, and these two types of scanning lines are intersected with one another to form a plurality of crossing positions. In a preferred embodiment of this invention, a plurality of preset keys are selected from the plurality of keys; based on that at least one ghost key and the selected plurality of preset keys share the same row scanning lines among the plurality of row scanning lines and the same column scanning lines among the plurality of column scanning lines, detecting at least one ghost key on the keyboard matrix according to the plurality of selected preset keys. Then, based on the plurality of examining keys including at least one of the detected ghost keys, a plurality of examining keys are selected from the plurality of preset keys and the detected ghost keys. Finally, based on that at least one hidden ghost key and the plurality of selected examining keys share the same row scanning lines among the plurality of row scanning lines and the same column scanning lines among the plurality of column scanning lines, at least one hidden ghost keys on the keyboard matrix are detected according to the plurality of examining keys.

To achieve the foregoing objective, the present invention further provides a system for detecting hidden ghost keys on a keyboard matrix, wherein a preset key selecting unit selects a plurality of preset keys on the keyboard matrix, and a ghost key detecting unit detects at least one ghost key according to the plurality of selected preset keys, based on that at least one ghost key and the plurality of selected preset keys share the same row scanning lines and the same column scanning lines. An examining key selecting unit selects a plurality of examining keys from the plurality of preset keys and the detected ghost keys, wherein the plurality of examining keys include at least one of the ghost keys. A hidden ghost key detecting unit detects at least one hidden ghost key according to the plurality of examining keys, based on that at least one hidden ghost key and the plurality of examining keys share the same row scanning lines and the same column scanning lines.

DETAILED DESCRIPTION OF THE PREFERRED EMBODIMENTS

Conventionally, for a circuit to detect scanning lines of a keyboard matrix, the position of a ghost key is detected when a key is pressed before a warning is issued or the ghost key is eliminated, but the conventional way has not considered the feature that the ghost key itself may also be determined as a pressed key, therefore the detection of the hidden ghost key should be eliminated. In the following embodiments, the method and the system for detecting hidden ghost keys are described in details, such that the keys can be installed at appropriate positions to avoid errors effectively.

Figure 1A:
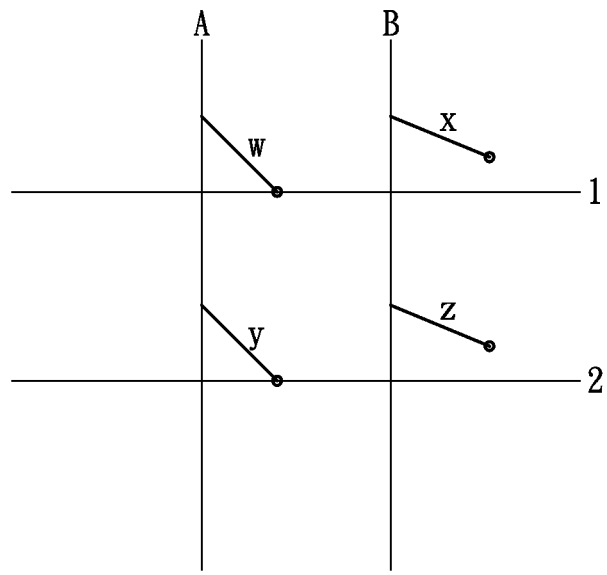
FIG. 1A is a schematic circuit diagram of a conventional keyboard matrix.
Figure 1B:
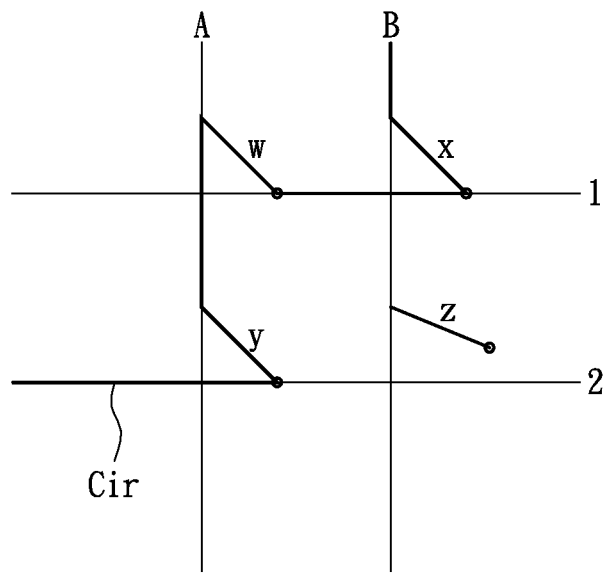
FIG. 1B is a schematic view of a loop path of a ghost key of a conventional keyboard matrix.
Figure 2:
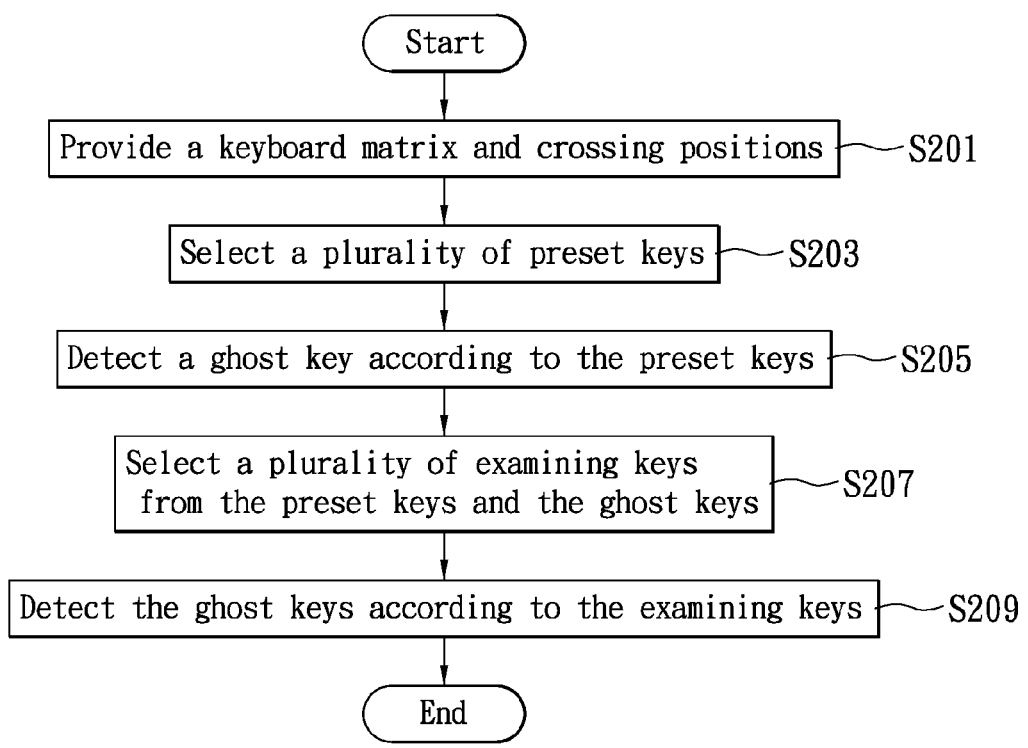
FIG. 2 is a flow chart of a method for detecting hidden ghost keys on a keyboard matrix in accordance with a preferred embodiment of the present invention.
Figure 3A:
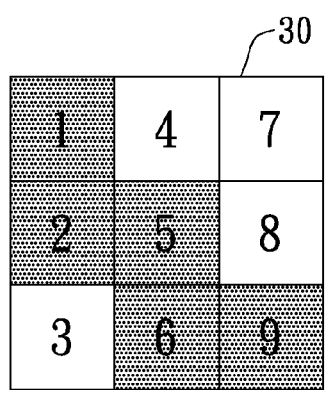
FIGS. 3A-3F are schematic views of a keyboard matrix in accordance with the present invention.

With reference to FIG. 2, which shows a flow chart of a method for detecting hidden ghost keys on a keyboard matrix in accordance with a preferred embodiment of the present invention, and FIG. 3A that shows a schematic view of the keyboard matrix, thereby a method for finding hidden ghost keys on a keyboard matrix 30 composed of a plurality of row scanning lines and a plurality of column scanning lines interlaced with one another is described.

In FIG. 3A, a keyboard matrix 30 composed of three rows and three columns with a total of nine elements is used for illustrating the present invention, wherein each row represents a row scanning line, and each column represents a column scanning line, and each element represents a crossing position of the row scanning line and the column scanning line, and these scanning lines are provided for determining an electric connection state at each crossing position, and so each crossing position is a position for installing a key, and thus there are nine key installation positions formed on the keyboard matrix 30 (S201).

A plurality of preset keys on the keyboard matrix 30 are selected (S203), such that when the plurality of selected preset keys are pressed simultaneously, then the scanning lines of the pressed preset keys form a loop accompanied with generation of the key control signal. Since the plurality of selected preset keys share the same row scanning lines and the same column scanning lines, thus other key positions may also form a loop due to sharing the same row scanning lines and the same column scanning lines with the pressed preset keys. Based on this principle, the positions forming a loop on the keyboard matrix 30 can be detected one by one according to the selected preset keys (S205), and these positions are where the so-called ghost keys are located.

In other words, if a user presses the plurality of preset keys at one time, the keys installed at the ghost key positions will be determined as pressed keys since there are existing common row scanning lines and column scanning lines in the plurality of preset key positions.

Similar to the principle of detecting ghost keys by a plurality of preset keys, by utilizing similar features between the hidden ghost key and the detected ghost keys, then the plurality of preset keys together with the detected ghost keys may be used to detect the hidden ghost keys. In other words, if the scanning lines of the plurality of preset keys and the ghost keys form a loop directly or indirectly, then the scanning lines of the hidden ghost keys will also form a loop, such that the keyboard controller may thereby determine that the keys at the preset key position, the ghost key position, and the hidden ghost keys are all at an operating state.

The plurality of examining keys selected from the plurality of preset keys and the detected ghost keys are used for detecting at least one hidden ghost key (S207), wherein at least one of the ghost keys that is detected in Step (S205) is included in the plurality of examining keys.

Specifically, the method for detecting the hidden ghost keys uses the same logic for detecting the ghost keys, and the previously detected ghost keys are used as a datum for detecting hidden ghost keys. In other words, when the row scanning lines and column scanning lines of a plurality of examining keys including at least one of the ghost keys form a loop, the crossing position of the keyboard matrix 30 where the hidden ghost key located would also form a loop indirectly (S209), wherein the detected hidden ghost keys are located on the crossing positions other than the crossing positions that the plurality of preset keys or the ghost keys located on.

Figure 3B:
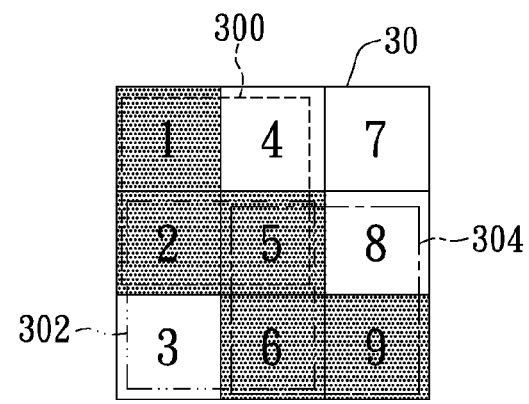

With reference to FIGS. 3A to 3F for schematic views of the aforementioned method for detecting hidden ghost keys in accordance with a preferred embodiment of the present invention, FIGS. 3A to 3F show a keyboard matrix 30 composed of three rows and three columns of scanning lines. For simplicity, the crossing position of each element in the keyboard matrix 30 of FIG. 3A is numbered from 1 to 9 sequentially by row and then by column. In other words, the elements 1 to 3 are situated in the same row, the elements 4 to 6 are situated in the same row, and the elements 7 to 9 are situated in the same row; and the elements 1, 4, and 7 are situated in the same column, the elements 2, 5, and 8 are situated in the same column, and the elements 3, 6, and 9 are situated in the same column. The crossing positions 1, 2, 5, 6, and 9 are used as an example of where the plural preset keys are located for illustrating the present invention. With reference to FIG. 3B for the characteristic of a positional relation of the preset key positions and the ghost key position, the preset key positions 1, 2, 4, and 5 share two of the three row scanning lines and two of three column scanning lines, and thus the preset key positions 1, 2, and 5 can be used for detecting that the crossing position 4 is a ghost key position (Group 300). Similarly, the preset key positions 2, 5, 6 and 5, 6, 9 can be used for detecting that the crossing positions 3 and 8 are also the ghost key positions (Groups 302 and 304) respectively.

Figure 3C:
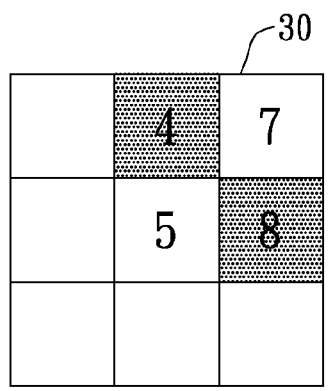
Figure 3D:
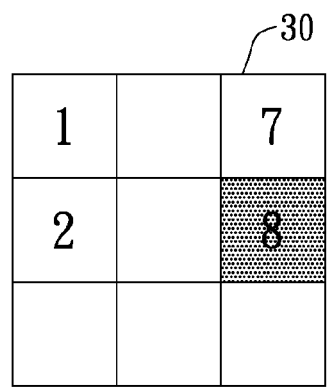
Figure 3E:
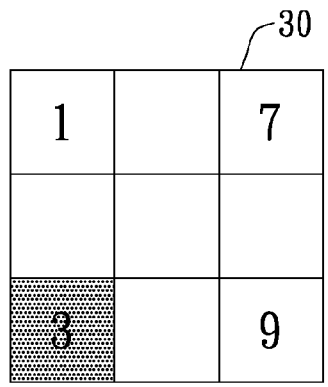
Figure 3F:
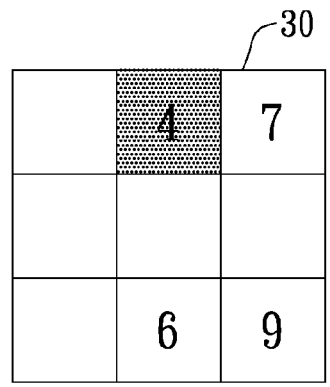

From the originally selected preset keys and the detected ghost keys, a plurality of examining keys including at least one ghost key such as three crossing positions 4, 5, and 8 are selected, wherein the positions 4 and 8 are the ghost key positions selected along the common row scanning lines and the column scanning lines, and the position 7 is detected to be the position that a hidden ghost key is located on (as shown in FIG. 3C). In this preferred embodiment, the hidden ghost key position 7 can also be detected from other examining keys combinations including: 1, 2, and 8 (as shown in FIG. 3D); 1, 3, and 9 (as shown in FIG. 3E); and 4, 6, and 9 (as shown in FIG. 3F). Two of the three examining key positions are in the same row, and two of the three examining key positions are in the same column, and each of the examining keys combination shares the same two row scanning lines and the same two column scanning lines to constitute a positional relation with the scanning lines of the hidden ghost keys.

Another preferred embodiment for detecting ghost key positions according to the preset key position and for detecting hidden ghost keys according to the examining positions is described as follows. This preferred embodiment uses the characteristic of the aforementioned positional relation as a measure for detecting hidden ghost keys.

Figure 4A:
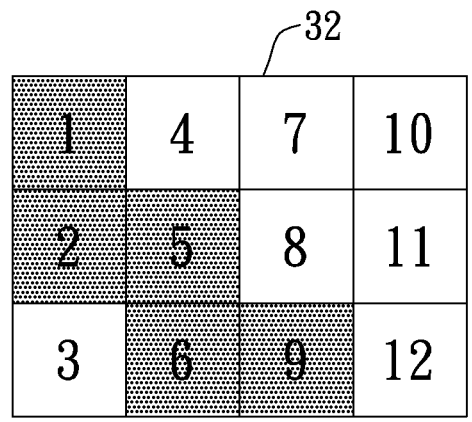
FIG. 4A is a schematic view of a method for detecting hidden ghost keys by the positions of installed keys in accordance with the present invention.

With reference to FIG. 4A, which shows a keyboard matrix 32 having four rows and three columns that form a matrix 32 with 12 crossing positions, the elements are numbered by rows and columns into 1 to 12, such that the elements 1 to 3 are situated in the first row, the elements 4 to 6 are situated in the second row, and so on and so forth; and the elements 1, 4, 7, and 10 are situated in the first column, the elements 2, 5, 8, and 11 are situated in the second column, and the elements 3, 6, 9, and 12 are situated in the third column. After the preset key positions 1, 2, 5, 6, and 9 are selected, three of the four preset key positions are selected for detecting the ghost key position.

For example, the crossing positions 1, 2, and 5 are selected as the positions the preset keys are installed:

Firstly, the numbers of the preset key positions are used for calculating the quotient obtained by dividing the position number by the total number of columns so as to determine the scanned column of each preset key position. The total number of columns in this preferred embodiment is equal to 3, so that the calculated results are 0.3, 0.6, and 1.6 respectively, and the decimal places of the quotients are round up unconditionally to integers 1, 1, and 2 respectively, and these integers show the column numbers where the three preset key positions are situated respectively. From these results, it can be determine that both preset key positions with the numbers 1 and 2 are situated in the first column, and the present key position with the number 5 is situated in the second column.

Now, the three preset key positions are determined whether or not they are situated in the same row. Firstly, the difference of numbers between the three preset key positions is calculated. In other words, the difference of numbers of the preset key positions 2 and 1 is equal to 1, and the difference of numbers of the preset key positions 5 and 1 is equal to 4, and the difference of numbers of the preset key positions 5 and 2 is equal to 3; and then the aforementioned differences are divided by the total number of columns and the reminders are equal to 1, 1, and 0 respectively. Since the difference of the preset key positions 5 and 2 can be divided by the column number with no remainder, therefore the preset key positions 5 and 2 are situated on the same column of the keyboard matrix 32.

From the aforementioned computational results, it is determined that the preset key positions 1 and 2 share the same row line, and the preset key positions 2 and 5 share the same column line, such that when the scanning lines at these three key positions are connected, a ghost key position will occur on the keyboard matrix 32. According to the principle of the preset key position and the ghost key position sharing the same two row scanning lines and two column scanning lines, it is determined that the ghost key position and the preset key position 1 are situated in the same column, and the ghost key position share the same row with the preset key position 5. In other words, the crossing position formed by crossing the column of the preset key position 1 with the row of the preset key position 5 is a ghost key position. Therefore, the number of the preset key position 1 is added to the difference of numbers of the preset key positions 5 and 2 in order to obtain the key position with the number 4, which is a ghost key position.

After a set of preset key positions are calculated, another set of three preset key positions in a different combination are used for repeating the aforementioned detection and calculation procedure. After the quotient obtained by dividing the number of the preset key position by the total number of columns is round up to an integer, a same result shows that the two key positions are situated in the same row. If the difference of the numbers of the two preset key positions is divisible by the total number of columns, then the two key positions are situated in the same column. After the positional relation of the three preset key positions is computed, such positional relation of the preset keys can be used for finding the crossing positions that the ghost keys are installed. After all ghost key positions are calculated, the same measure is used to calculate the hidden ghost keys one by one. However, the difference of computing the hidden ghost keys resides on that the examining keys selected for computing the hidden ghost keys include at least one ghost key.

According to the aforementioned computation method, the ghost keys are situated at the crossing positions 3, 4, and 8, and the hidden ghost key is situated at the crossing position 7 after the crossing positions 1, 2, 5, 6, and 9 are selected as the preset key positions in this preferred embodiment.

The method of computing the locations of the ghost keys and the hidden ghost keys on the matrix is not limited to the aforementioned measure only, as an example, the numbers of the crossing positions may also be arranged by column first and then by row, and the "total number of columns" in this case is changed to the "total number of rows" to find the quotient and the remainder, in order to find the ghost key positions and the hidden ghost key positions. In addition, the order of computing the crossing positions that are in the same row first or in the same column first is not important.

Figure 4B:
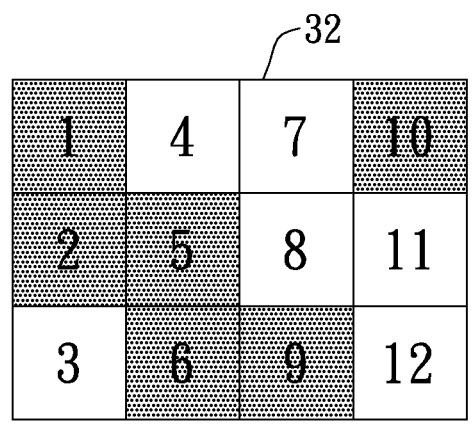
FIG. 4B is a schematic view of a method for arranging keys of a keyboard in accordance with the present invention.

With reference to FIG. 4A for a keyboard matrix 32 and multiple selected preset keys. Therein if it is necessary to install a new key after the ghost keys and the hidden ghost keys have been formed by pressing five preset keys simultaneously, then a crossing position (such as one of the key positions from 10 to 12 in the keyboard matrix 32) other than the five preset key positions, the ghost key positions, or the hidden ghost key positions can be selected as the new key's installation position. With reference to FIG. 4B, the aforementioned detection method is used for detecting ghost key positions according to the preset key positions 1, 2, 5, 6, 9, and 10 after a new preset key position (such as the key position 10) is selected. If the keys at the foregoing six key positions are detected and determined to be pressed simultaneously, the key position 11 is then a ghost key's position, and the key position 12 is then subsequently another hidden ghost key's position.

The present invention further provides a method for arranging the keys on a keyboard, wherein the aforementioned detection method is used, and the positions for installing the preset keys are selected from the keyboard matrix; and the ghost keys and the hidden ghost keys are detected; wherein key positions other than the ghost keys and the hidden ghost keys are detected repeatedly until a sufficient number of key positions are selected, and the keys of the keyboard can be set to the selected positions.

The advantages of this method for arranging keys on a matrix of a keyboard are listed below. Even if a plurality of keys are pressed simultaneously to form a loop directly by some of the row scanning lines and column scanning lines of the keyboard matrix, the ghost key positions and the hidden ghost key positions were installed with no key, and so thereby prevent a key signal receiving end (such as a main system) from receiving a wrong key signal, since all keys are installed at positions other than the ghost key positions and the hidden ghost key positions.

Figure 5:
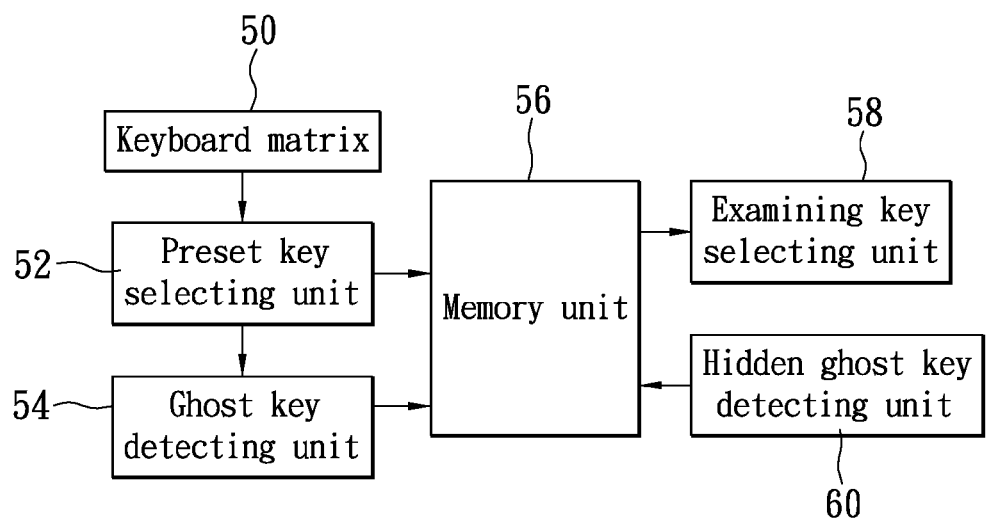
FIG. 5 is a block diagram of a system for detecting hidden ghost keys on a keyboard matrix in accordance with the present invention.

With reference to FIG. 5, which shows a block diagram of a system for detecting a hidden ghost keys on a keyboard matrix in accordance with a preferred embodiment of the present invention, the system comprises a keyboard matrix 50, a preset key selecting unit 52, a ghost key detecting unit 54, a memory unit 56, an examining key selecting unit 58, and a hidden ghost key detecting unit 60.

The keyboard matrix 50 is composed of a plurality of row scanning lines and a plurality of column scanning lines intersected with one another, and a plurality of crossing positions are formed at the intersections, wherein a key can be installed at each crossing position.

Figure 6:
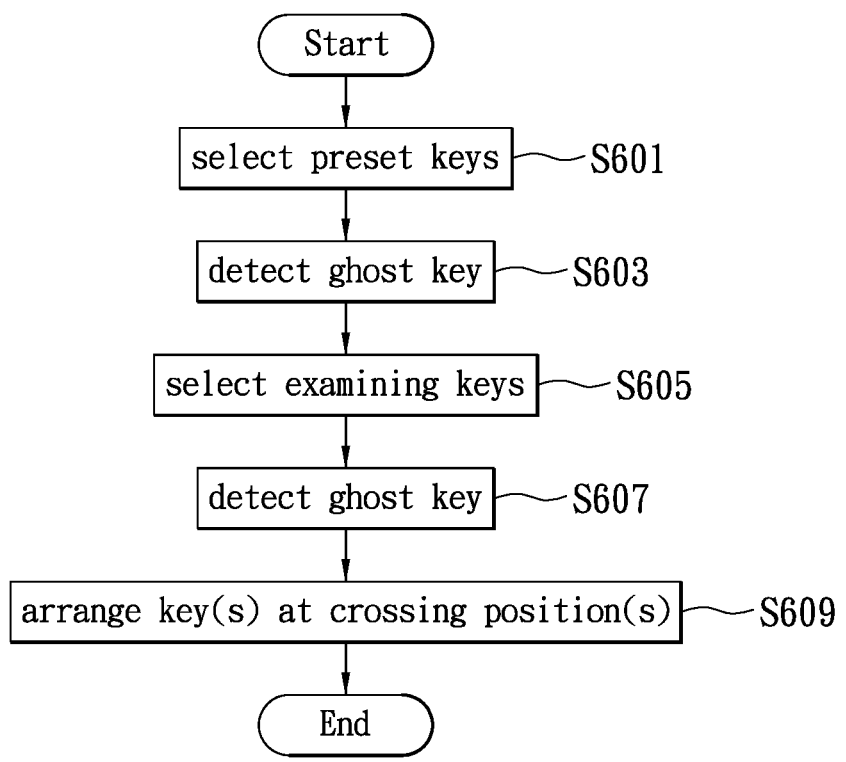
FIG. 6 is a flow chart describing a method for detecting hidden ghost keys on a keyboard matrix in one embodiment of the present invention.

Reference is made to FIG. 5 in view of FIG. 6. The preset key selecting unit 52 selects plurality of preset keys from crossing positions of the keyboard matrix 50 (step S601), and the crossing positions of the plurality of selected preset keys are stored in the memory unit 56. Such as step S603, the ghost key detecting unit 54 detects the ghost key positions on the keyboard matrix 50 one by one according to the plurality of preset keys selected by the preset key selecting unit 52, and the ghost key positions and the selected preset key positions share the same two row scanning lines among the plurality of the row scanning lines, and also share two column scanning lines among the plurality of the column scanning lines. The ghost key positions detected by the ghost key detecting unit 54 are stored in the memory unit 56.

To further find a hidden ghost key, the examining key selecting unit 58 selects the preset keys selected by the preset key selecting unit 52, and selects a plurality of examining keys from the ghost keys that have been detected by the ghost key detecting unit 54 (step S605). Since the preset key positions and the ghost key positions are stored in the memory unit 56, the examining key selecting unit 58 can read a plurality of key positions from the memory unit 56 as the examining key positions.

The examining keys selected by the examining key selecting unit 58 include at least one of the detected ghost keys. For example, three examining keys are selected, and the number of ghost keys can be one to three.

Next, such as step S607, the hidden ghost key detecting unit 60 detects a hidden ghost key according to the examining keys selected by the examining key selecting unit 58. The hidden ghost keys and the examining keys have the feature of sharing the same two row scanning lines and the same two column scanning lines. The examining key selecting unit 58 and the hidden ghost key detecting unit 60 can perform the selection and detection operations repeatedly until all hidden ghost keys are detected. The hidden ghost key detecting unit 60 can detect the hidden ghost keys and store the positions of the detected hidden ghost keys into the memory unit 56.

The measure for the ghost key detecting unit 54 and the hidden ghost key detecting unit 60 to detect the ghost keys or the hidden ghost keys can be implemented by software and hardware, and the characteristic of the "positional relation" of a key position sharing the same row scanning lines and the same column scanning lines can be used for the computation.

If it is necessary to arrange the keys on a keyboard matrix 50 of a keyboard, the system of the aforementioned preferred embodiment can be used for finding the ghost key positions and the hidden ghost key positions, and a display interface (not shown in the figure) is used for displaying the keyboard matrix 50, and the ghost key positions and the hidden ghost keys are read from the memory unit 56. The keys can be arranged at the positions on the keyboard matrix 50 other than the ghost key positions and the hidden ghost key positions according to the contents displayed by the display interface (step S609).

In summation of the description of the foregoing preferred embodiments and the illustration of the drawings, the present invention provides a system and a method for detecting hidden ghost keys on a keyboard matrix, wherein the characteristic of the keyboard matrix is used to find a plurality of pressed keys more accurately than the prior art, and eliminate the interference by other key positions, so as to provide keyboard manufacturers a better way of preventing output errors of a keyboard. More particularly, a keyboard with high stability and quality is provided for playing a computer game that requires several combinations of keys.

The above-mentioned descriptions represent merely the preferred embodiments of the present invention, without any intention to limit the scope of the present invention thereto. Various equivalent changes, alternations, or modifications based on the claims of the present invention are all consequently viewed as being embraced by the scope of the present invention.

What is claimed is:

1. A method for detecting hidden ghost keys from a plurality of keys, and the plurality of keys are installed on a plurality of crossing positions of a keyboard matrix formed by crossing a plurality of row scanning lines and a plurality of column scanning lines, and the method comprising:

selecting a plurality of preset keys from the plurality of keys;

based on that at least one ghost key and the selected plurality of preset keys share the same row scanning lines among the plurality of row scanning lines and the same column scanning lines among the plurality of column scanning lines, detecting at least one ghost key on the keyboard matrix according to the selected plurality of preset keys;

based on a plurality of examining keys including at least one of the detected ghost keys, selecting the plurality of examining keys from the selected plurality of preset keys and the detected ghost keys; and based on at least one hidden ghost key and the selected examining keys sharing the same row scanning lines among the plurality of row scanning lines and the same column scanning lines among the plurality of column scanning lines, detecting at least one hidden ghost key on the keyboard matrix according to the plurality of examining keys.

2. The method of claim 1, wherein, when the plurality of preset keys are pressed, the plurality of row scanning lines and the plurality of column scanning lines where the preset keys are located on are driven to form a loop.

3. The method of claim 2, wherein, when the plurality of preset keys are pressed, the plurality of row scanning lines and the plurality of column scanning lines where the plurality of preset keys and the ghost keys are located on are driven to form a loop.

4. The method of claim 1, wherein the step of detecting the ghost keys according to the selected plurality of preset keys further comprises: if first and second preset keys in the selected plurality of examining keys share the same row scanning line in the keyboard matrix, and the first and third preset keys in the selected plurality of examining keys share the same column scanning line in the keyboard matrix, then the detected key installed on the column scanning line of the second preset key and the row scanning line of the third preset key is the ghost key.

5. The method of claim 1, wherein the step of detecting the hidden ghost keys according to the plurality of examining keys further comprises: if first and second examining keys of the plurality of examining keys share the same row scanning line in the keyboard matrix, and the first and third examining keys of the plurality of examining keys share the same column scanning line in the keyboard matrix, then the detected key installed on the column scanning line of the second examining key and the row scanning line of the third examining key is the hidden ghost key.

6. The method of claim 5, wherein the step of detecting the hidden ghost keys according to the plurality of examining keys detects the hidden ghost keys by at least three examining keys.

7. A method for arranging keys on a keyboard, using the method of claim 1 to arrange keys at the crossing positions other than the crossing positions of the ghost keys and the hidden ghost keys.

8. A system for detecting hidden ghost keys in a keyboard matrix, comprising:
- a keyboard matrix, composed of a plurality of row scanning lines and a plurality of column scanning lines intersected with one another to form a plurality of crossing positions where a plurality of keys is installed;
- a preset key selecting unit, for selecting a plurality of preset keys from the plurality of keys;
- a ghost key detecting unit, for detecting a ghost key based on that at least one ghost key and the selected preset keys share the same row scanning lines among the plurality of row scanning lines and the same column scanning lines among the plurality of column scanning lines;
- an examining key selecting unit, for selecting a plurality of examining keys, based on that at least one of the ghost keys is included in the selected plurality of examining keys, from the plurality of preset keys and the detected ghost keys; and
- a hidden ghost key detecting unit, for detecting a hidden ghost key based on that the hidden ghost key and the plurality of examining keys share the same plurality of row scanning lines and the same plurality of column scanning lines, wherein the hidden ghost key is installed on the crossing position other than where the plurality of preset keys and the ghost key.

9. The system of claim 8, further comprising: a memory unit, for recording the crossing positions where the plurality of preset keys, the ghost key, or the hidden ghost key are installed.

10. The system of claim 9, wherein the examining key selecting unit reads the crossing positions of the plurality of preset keys and the ghost keys from the memory unit to select the examining keys.

\* \* \* \* \*